(12) United States Patent
Sawada et al.

(10) Patent No.: US 11,881,850 B2
(45) Date of Patent: Jan. 23, 2024

(54) DRIVING APPARATUS

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Ryohei Sawada, Yokkaichi (JP); Masayuki Kato, Yokkaichi (JP); Kota Oda, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/757,556

(22) PCT Filed: Dec. 2, 2020

(86) PCT No.: PCT/JP2020/044839
§ 371 (c)(1),
(2) Date: Jun. 16, 2022

(87) PCT Pub. No.: WO2021/124893
PCT Pub. Date: Jun. 24, 2021

(65) Prior Publication Data
US 2023/0014972 A1 Jan. 19, 2023

(30) Foreign Application Priority Data

Dec. 19, 2019 (JP) .................................. 2019-229585

(51) Int. Cl.
*H03K 17/687* (2006.01)
*H03K 17/567* (2006.01)

(52) U.S. Cl.
CPC ......... *H03K 17/687* (2013.01); *H03K 17/567* (2013.01); *H03K 2217/0081* (2013.01)

(58) Field of Classification Search
None
See application file for complete search history.

(56) References Cited

U.S. PATENT DOCUMENTS 6,724,227 B2 * 4/2004 Imai ................. H03K 17/04123
327/434
2007/0252637 A1 11/2007 Zhou et al.
(Continued)

FOREIGN PATENT DOCUMENTS

JP H7-240676 A 9/1995
JP H10-022803 A 1/1998
(Continued)

OTHER PUBLICATIONS

International Search Report, Application No. PCT/JP2020/044839, dated Dec. 28, 2020. ISA/Japan Patent Office.

*Primary Examiner* — Kenneth B Wells
(74) *Attorney, Agent, or Firm* — Honigman LLP (57) ABSTRACT

A driving apparatus drives a load. An N-channel MOSFET is disposed downstream of the load on a current path of a current that flows via the load. A circuit resistor is connected between a direct current power source and the gate of the MOSFET. A first switch is connected between the gate and the source of the MOSFET. A microcomputer outputs a voltage relative to a potential at an output terminal of a second switch to a control terminal of the second switch. As a result, the second switch is turned ON or OFF. A switching circuit turns the first switch ON when the second switch is turned ON and turns the first switch OFF when the second switch is turned OFF.

4 Claims, 6 Drawing Sheets

(56) References Cited

U.S. PATENT DOCUMENTS

2012/0126858 A1   5/2012   Senda et al.
2017/0346274 A1   11/2017  Nakahara et al.

FOREIGN PATENT DOCUMENTS

JP   2011-216229 A   10/2011
JP   2017-073657 A   4/2017

* cited by examiner

LEGEND
A= Microcomputer

LEGEND
A= Microcomputer

LEGEND
A= Microcomputer

DRIVING APPARATUS

CROSS-REFERENCE TO RELATED APPLICATIONS

This application is the U.S. national stage of PCT/JP2020/044839 filed on Dec. 2, 2020, which claims priority of Japanese Patent Application No. JP 2019-229585 filed on Dec. 19, 2019, the contents of which are incorporated herein.

TECHNICAL FIELD

The present disclosure relates to a driving apparatus.

BACKGROUND

A power supply system in which a direct current power source such as a battery supplies power to a load is installed in a vehicle. The power supply system includes a driving apparatus that drives the load. JP 2011-216229A discloses a driving apparatus that drives a load. The driving apparatus includes a switch that is disposed downstream of the load on a path of a current flowing via the load, and a driving circuit that turns the switch ON or OFF. When the switch is turned ON, a current flows from a direct current power source to the load and the switch in this order, and power is supplied to the load.

The switch is an N-channel FET (Field Effect Transistor). The drain of the switch is connected to the load. The source of the switch is grounded. The driving circuit outputs a control signal that is constituted by a high level voltage and a low level voltage to the gate of the switch. The switch is turned ON when the voltage at the gate relative to the potential at the source is greater than or equal to a threshold value, and turned OFF when the voltage at the gate relative to the potential at the source is less than the threshold value. The driving circuit turns the switch ON by switching the voltage of the control signal to the high level, and turns the switch OFF by switching the voltage of the control signal to the low level.

In conventional driving apparatuses such as that described in JP 2011-216229A, the driving circuit is grounded via a conducting wire. Grounding is realized through connection to a ground conductor. One end of the conducting wire is connected to the driving circuit. The other end of the conducting wire is grounded. The voltage of the control signal output from the driving circuit is a voltage relative to the potential at the one end of the conducting wire. In the vehicle, electrical devices other than the load may also be grounded via the common conducting wire. In this configuration, a current flowing through the conducting wire varies when the electrical devices operate or stop operation. The conducting wire usually includes an inductive component and a resistive component. Accordingly, when a current flowing through the conducting wire varies, the voltage at the one end of the conducting wire relative to a ground potential varies as well. Also, even when an electrical device is not grounded via the common conducting wire, the voltage at the one of the conducting wire relative to the ground potential varies when a current due to noise flows through the conducting wire or a contact resistance of the conducting wire at the ground conductor increases.

Since the source of the switch is grounded, the switch is turned ON or OFF according to the voltage at the gate relative to the ground potential. When the voltage at the one end of the conducting wire relative to the ground potential is a negative voltage, there is a possibility that the switch will not be turned ON although the voltage of the control signal that is output is the high level voltage. When the voltage at the one end of the conducting wire relative to the ground potential is high, there is a possibility that the switch will not be turned OFF although the voltage of the control signal that is output is the low level voltage.

Therefore, an object is to provide a driving apparatus capable of correctly turning the switch ON or OFF even when the reference potential for the control voltage varies.

SUMMARY

A driving apparatus according to an aspect of the present disclosure is a driving apparatus for driving a load, including: an N-channel MOSFET that is disposed downstream of the load on a current path of a current that flows via the load; a resistor that is connected between a direct current power source and the gate of the MOSFET; a first switch that is connected between the gate and the source of the MOSFET; a second switch that is turned ON when a voltage at a control terminal relative to a potential at an output terminal from which a current is output is greater than or equal to a threshold value; a switching circuit configured to turn the first switch ON when the second switch is turned ON and turn the first switch OFF when the second switch is turned OFF; and an output unit configured to output a voltage relative to the potential at the output terminal of the second switch to the control terminal of the second switch.

Advantageous Effects of Invention

According to the present disclosure, a MOSFET can be correctly turned ON or OFF even when the reference potential for the control voltage varies.

DETAILED DESCRIPTION OF PREFERRED EMBODIMENTS

First, aspects of implementation of the present disclosure will be listed and described. At least some of the following embodiments may be suitably combined.
First Aspect
A driving apparatus according to a first aspect of the present disclosure is a driving apparatus for driving a load, including: an N-channel MOSFET that is disposed downstream of the load on a current path of a current that flows via the load; a resistor that is connected between a direct current power source and the gate of the MOSFET; a first switch that is connected between the gate and the source of the MOSFET; a second switch that is turned ON when a voltage at a control terminal relative to a potential at an output terminal from which a current is output is greater than or equal to a threshold value; a switching circuit configured to turn the first switch ON when the second switch is turned ON and turn the first switch OFF when the second switch is turned OFF; and an output unit configured to output a voltage relative to the potential at the output terminal of the second switch to the control terminal of the second switch.

According to the first aspect, the output unit outputs a control voltage relative to the potential at the output terminal of the second switch. The second switch is turned ON or OFF according to the voltage at the control terminal relative to the potential at the output terminal. Therefore, the second switch is correctly turned ON or OFF even when the reference potential for the control voltage, i.e., the voltage at the output terminal of the second switch relative to a ground potential varies.

The switching circuit turns the first switch ON when the second switch is turned ON. When the first switch is turned ON, in the MOSFET, the voltage at the gate relative to the potential at the source decreases to 0 V, and the MOSFET is turned OFF. The switching circuit turns the first switch OFF when the second switch is turned OFF. When the first switch is turned OFF, in the MOSFET, the voltage at the gate relative to the potential at the source increases, and the MOSFET is turned ON. When the second switch is switched correctly, the MOSFET is also switched correctly. Consequently, the MOSFET is correctly turned ON or OFF even when the reference potential for the control voltage varies.

Second Aspect

In the driving apparatus according to a second aspect of the present disclosure, the output terminal of the second switch is connected to a ground conductor via a first conducting wire, and the source of the MOSFET is connected to the ground conductor via a second conducting wire.

According to the second aspect, grounding is realized through connection to the ground conductor. The first conducting wire includes an inductive component and a resistive component. Therefore, when the current flowing through the first conducting wire varies, the voltage at the output terminal of the second switch relative to the potential at the ground conductor, i.e., relative to the ground potential varies.

Third Aspect

In the driving apparatus according to a third aspect of the present disclosure, the first switch is turned ON when a voltage at a control terminal relative to a potential at an output terminal from which a current is output is greater than or equal to a second threshold value. The driving apparatus further includes a second resistor that is connected between the control terminal and the output terminal of the first switch. An input terminal of the first switch to which a current is input is connected to the gate of the MOSFET. The output terminal of the first switch is connected to the source of the MOSFET. The switching circuit includes: a third switch that is turned ON when a voltage at a control terminal relative to a potential at an input terminal to which a current is input is less than a third threshold value; and a third resistor that is connected between the control terminal and the input terminal of the third switch. The input terminal of the third switch is connected to the direct current power source. An output terminal of the third switch from which a current is output is connected to the control terminal of the first switch. The control terminal of the third switch is connected to an input terminal of the second switch to which a current is input.

According to the third aspect, for example, the source of the MOSFET and the output terminal of the second switch are grounded separately from each other. When the second switch is turned ON, a current flows through the third resistor and the second switch in this order. At this time, in the third switch, the voltage at the control terminal relative to the potential at the input terminal is a negative voltage and is less than the third threshold value. Therefore, when the second switch is turned ON, the third switch is turned ON. When the third switch is turned ON, a current flows through the third switch and the second resistor in this order. At this time, in the first switch, the voltage at the control terminal relative to the potential at the output terminal is a positive voltage and is greater than or equal to the second threshold value. Therefore, when the third switch is turned ON, the first switch is turned ON.

When the second switch is turned OFF, a current does not flow through the third resistor. At this time, in the third switch, the voltage at the control terminal relative to the potential at the input terminal is 0 V and is greater than or equal to the third threshold value. Therefore, when the second switch is turned OFF, the third switch is turned OFF. When the third switch is turned OFF, a current does not flow through the second resistor. At this time, in the first switch, the voltage at the control terminal relative to the potential at the output terminal is 0 V and is less than the second threshold value. Therefore, when the third switch is turned OFF, the first switch is turned OFF.

The following describes specific examples of power supply systems according to embodiments of the present disclosure with reference to the drawings. The present invention is not limited to these examples but is indicated by the claims, and all modifications that fall within the meaning and range of equivalency with the claims are intended to be encompassed therein.

Embodiment 1

Configuration of Power Supply System

Figure 1:
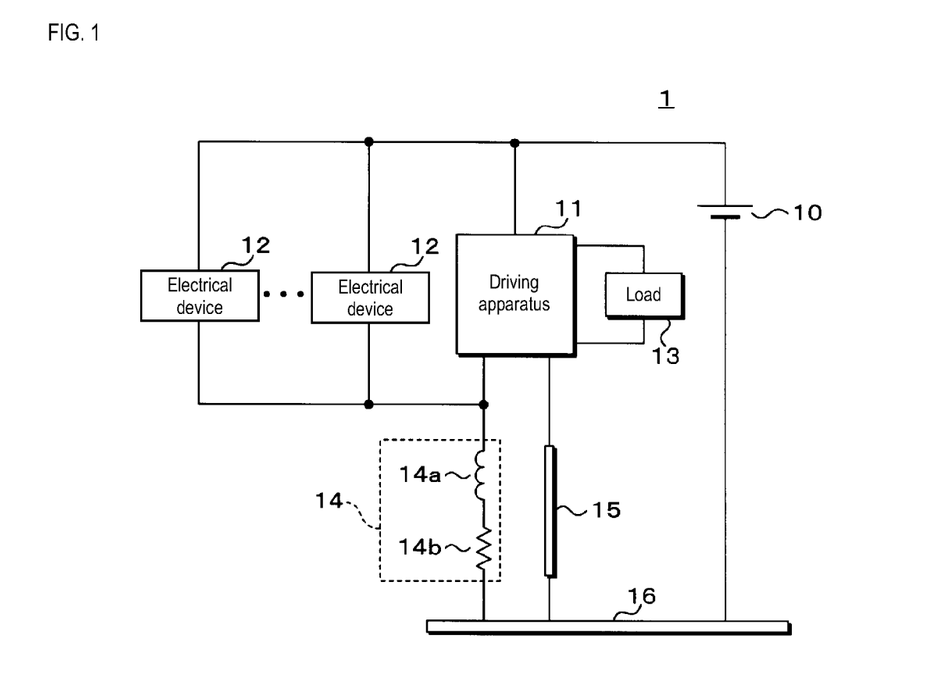
FIG. 1 is a block diagram showing the configuration of a main portion of a power supply system in Embodiment 1.

FIG. 1 is a block diagram showing the configuration of a main portion of a power supply system 1 in Embodiment 1. The power supply system 1 is preferably installed in a vehicle and includes a direct current power source 10, a driving apparatus 11, a plurality of electrical devices 12, a load 13, a first conducting wire 14, a second conducting wire 15, and a ground conductor 16. The direct current power source 10 is a battery, for example. The load 13 is an electrical device installed in the vehicle. The electrical devices 12 are ECUs (Electronic Control Units), for example. The first conducting wire 14 and the second conducting wire 15 each include an inductive component and a resistive component. An equivalent circuit of the first conducting wire 14 is represented by a series circuit including an inductor 14a and a conducting wire resistor 14b. One end and the other end of the first conducting wire 14 correspond to one end and the other end of the series circuit, respectively. An equivalent circuit of the second conducting wire 15 can also be represented by a series circuit including an inductor and a conducting wire resistor.

The positive electrode of the direct current power source 10 is connected to the driving apparatus 11 and the plurality of electrical devices 12 individually. The driving apparatus 11 is connected to one end and the other end of the load 13 individually. The negative electrode of the direct current power source 10 is connected to the ground conductor 16. The driving apparatus 11 and the plurality of electrical devices 12 are connected to one end of the first conducting wire 14. The other end of the first conducting wire 14 is connected to the ground conductor 16. The driving apparatus 11 is further connected to one end of the second conducting wire 15. The other end of the second conducting wire 15 is connected to the ground conductor 16.

The ground conductor 16 is the body of the vehicle, for example. The negative electrode of the direct current power source 10 is grounded by being connected to the ground conductor 16. The driving apparatus 11 and the plurality of electrical devices 12 are grounded by being connected to the ground conductor 16 via the first conducting wire 14.

The direct current power source 10 supplies power to the driving apparatus 11 and the plurality of electrical devices 12. When power is supplied from the direct current power source 10 to the driving apparatus 11, a current flows from the positive electrode of the direct current power source 10 through the driving apparatus 11, the first conducting wire 14, and the ground conductor 16 in this order, and returns to the negative electrode of the direct current power source 10. When power is supplied from the direct current power source 10 to the electrical devices 12, a current flows from the positive electrode of the direct current power source 10 through the electrical devices 12, the first conducting wire 14, and the ground conductor 16 in this order, and returns to the negative electrode of the direct current power source 10.

When the electrical devices 12 operate or stop operation, currents output from the electrical devices 12 to the first conducting wire 14 vary. When the electrical devices 12 operate, currents output from the electrical devices 12 to the first conducting wire 14 increase. When the electrical devices 12 stop operation, currents output from the electrical devices 12 to the first conducting wire 14 decrease.

The plurality of electrical devices 12 operate or stop operation independently of each other. Accordingly, the current flowing through the first conducting wire 14 varies considerably. When the current flowing through the first conducting wire 14 increases, the voltage drop across the conducting wire resistor 14b of the first conducting wire 14 increases, and therefore, the voltage at the one end of the first conducting wire 14 relative to the potential at the ground conductor 16 increases. The greater the increase in the current flowing through the first conducting wire 14 is, the greater the increase in the voltage at the one end of the first conducting wire 14 relative to the potential at the ground conductor 16 is.

When the current flowing through the first conducting wire 14 decreases, the inductor 14a reduces the voltage at the one end of the first conducting wire 14 relative to the potential at the ground conductor 16 side end. As a result, the voltage at the one end of the first conducting wire 14 relative to the potential at the ground conductor 16 decreases. The greater the reduction in the current flowing through the first conducting wire 14 is, the greater the reduction in the voltage at the one end of the first conducting wire 14 relative to the potential at the ground conductor 16 is.

For the reasons described above, the voltage at the one end of the first conducting wire 14 relative to the potential at the ground conductor 16 varies. The voltage at the one end of the first conducting wire 14 is the voltage at the connection node between the driving apparatus 11 and the first conducting wire 14.

A configuration is also possible in which the power supply system 1 does not include the electrical devices 12. That is, a configuration is also possible in which the electrical devices 12 are not connected to the one end of the first conducting wire 14. In this case as well, the current flowing through the first conducting wire 14 varies when a current due to noise flows through the first conducting wire 14 or a contact resistance of the first conducting wire 14 at the ground conductor 16 increases. As a result, the voltage at the one end of the first conducting wire 14 relative to the potential at the ground conductor 16 varies.

The following describes as an example a configuration in which the plurality of electrical devices 12 are connected to the one end of the first conducting wire 14.

One end of the load 13 is connected to the positive electrode of the direct current power source 10 via the driving apparatus 11. The driving apparatus 11 includes an N-channel MOSFET (Metal-Oxide-Semiconductor Field Effect Transistor) 20 (see FIG. 2) that functions as a switch. The other end of the load 13 is connected to the ground conductor 16 via the MOSFET 20 and the second conducting wire 15. The driving apparatus 11 turns the MOSFET 20 ON. As a result, the direct current power source 10 supplies power to the load 13 and the load 13 operates. The driving apparatus 11 drives the load 13 by turning the MOSFET 20 ON. The driving apparatus 11 turns the MOSFET 20 OFF. As a result, the direct current power source 10 stops power supply to the load 13 and the load 13 stops operation.

The driving apparatus 11 is capable of turning the MOSFET 20 ON or OFF correctly even when the voltage at the one end of the first conducting wire 14 relative to the potential at the ground conductor 16 varies as described later.

Configuration of Driving Apparatus 11

Figure 2:
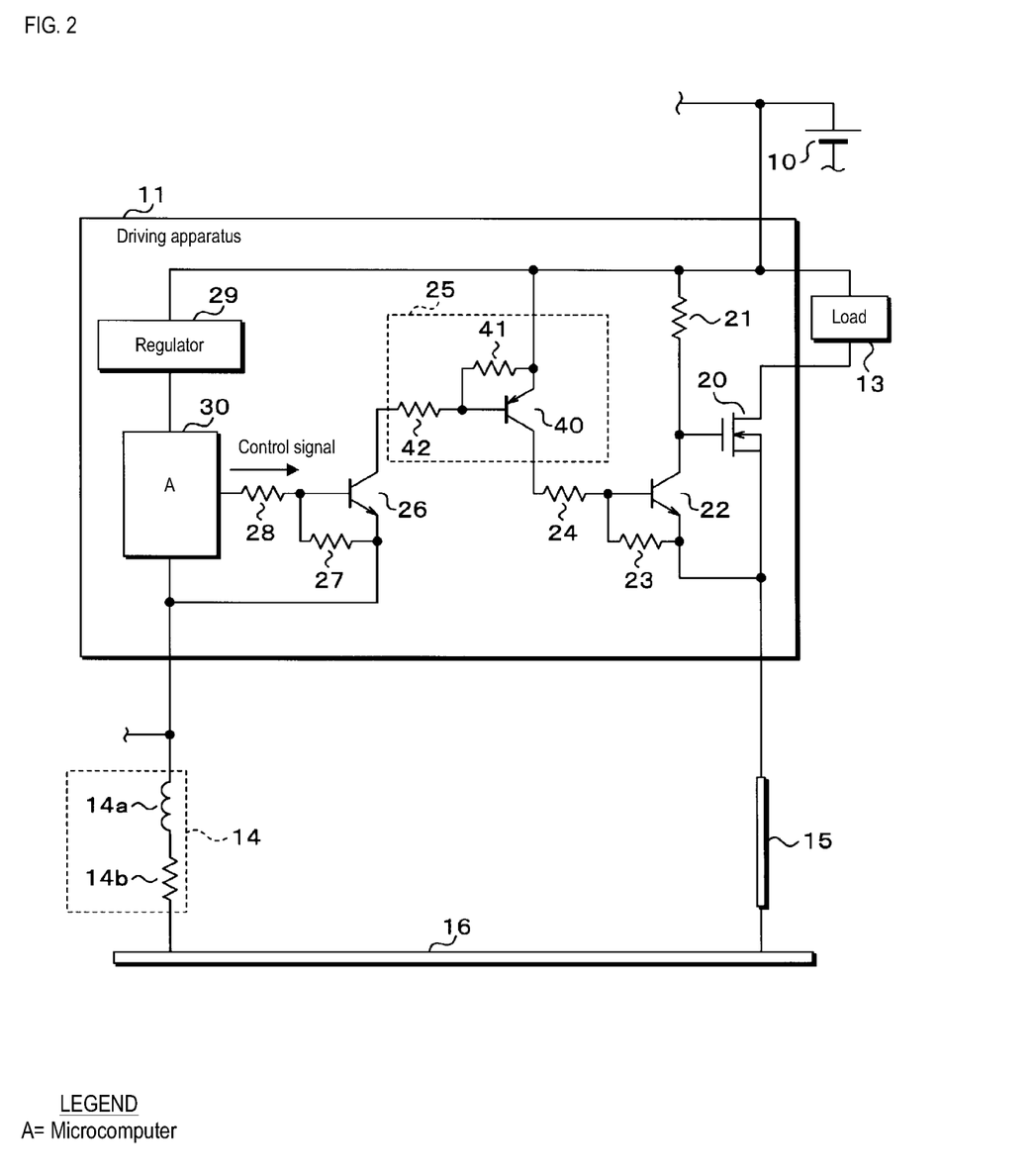
FIG. 2 is a circuit diagram of a driving apparatus.

FIG. 2 is a circuit diagram of the driving apparatus 11. The driving apparatus 11 includes a circuit resistor 21, a first switch 22, first switch resistors 23 and 24, a switching circuit 25, a second switch 26, second switch resistors 27 and 28, a regulator 29, and a microcomputer 30, in addition to the MOSFET 20. The switching circuit 25 includes a third switch 40 and third switch resistors 41 and 42. Each of the first switch 22 and the second switch 26 is an NPN bipolar transistor. The third switch 40 is a PNP bipolar transistor.

The drain of the MOSFET 20 is connected to the other end of the load 13. The source of the MOSFET 20 is connected to the ground conductor 16 via the second conducting wire 15. One end of the circuit resistor 21 is connected to the positive electrode of the direct current power source 10. The other end of the circuit resistor 21 is connected to the gate of the MOSFET 20. The gate of the MOSFET 20 is further connected to the collector of the first switch 22. The emitter of the first switch 22 is connected to the source of the MOSFET 20 and the one end of the second conducting wire 15. The first switch resistor 23 is connected between the base and the emitter of the first switch 22. The first switch resistor 23 functions as a second resistor. The base of the first switch 22 is further connected to one end of the first switch resistor 24.

The positive electrode of the direct current power source 10 is connected to the emitter of the third switch 40 included in the switching circuit 25. The collector of the third switch 40 is connected to the other end of the first switch resistor 24. In the switching circuit 25, the third switch resistor 41 is connected between the base and the emitter of the third switch 40. The third switch resistor 41 functions as a third resistor. The base of the third switch 40 is further connected to one end of the third switch resistor 42.

The other end of the third switch resistor 42 is connected to the collector of the second switch 26. The emitter of the second switch 26 is connected to the one end of the first conducting wire 14. The second switch resistor 27 is connected between the base and the emitter of the second switch 26. The base of the second switch 26 is further connected to one end of the second switch resistor 28. The other end of the second switch resistor 28 is connected to the microcomputer 30.

The positive electrode of the direct current power source 10 is connected to the regulator 29. The regulator 29 is further connected to the microcomputer 30. The microcomputer 30 is further connected to the one end of the first conducting wire 14.

As described above, the first switch 22 is connected between the gate and the source of the MOSFET 20. The emitter of the second switch 26 is connected to the ground conductor 16 via the first conducting wire 14. The plurality of electrical devices 12 are connected to the connection node between the emitter of the second switch and the first conducting wire 14. The collector of the third switch 40 is connected to the base of the first switch 22 via the first switch resistor 24. The base of the third switch 40 is connected to the collector of the second switch 26 via the third switch resistor 42.

Operation of Driving Apparatus 11

In the MOSFET 20, when the voltage at the gate relative to the potential at the source is greater than or equal to a gate threshold value, the value of a resistance between the drain and the source is sufficiently small. At this time, the MOSFET 20 is in the ON state and a current can flow via the drain and the source. In the MOSFET 20, when the voltage at the gate relative to the potential at the source is less than the gate threshold value, the value of a resistance between the drain and the source is sufficiently large. At this time, the MOSFET 20 is in the OFF state and a current does not flow via the drain and the source. The gate threshold value is a positive constant value that is set in advance.

In the first switch 22, when the voltage at the base relative to the potential at the emitter is greater than or equal to a first voltage threshold value, the value of a resistance between the collector and the emitter is sufficiently small. At this time, the first switch 22 is in the ON state and a current can flow via the collector and the emitter. In the first switch 22, when the voltage at the base relative to the potential at the emitter is less than the first voltage threshold value, the value of a resistance between the collector and the emitter is sufficiently large. At this time, the first switch 22 is in the OFF state and a current does not flow via the collector and the emitter. The first voltage threshold value is a positive constant value that is set in advance. The first voltage threshold value corresponds to a second threshold value.

The second switch 26 is configured similarly to the first switch 22. In the second switch 26, when the voltage at the base relative to the potential at the emitter is greater than or equal to a second voltage threshold value, the second switch 26 is in the ON state. In the second switch 26, when the voltage at the base relative to the potential at the emitter is less than the second voltage threshold value, the second switch 26 is in the OFF state. The second voltage threshold value is a positive constant value that is set in advance.

In the third switch 40, when the voltage at the base relative to the potential at the emitter is less than a third voltage threshold value, the value of a resistance between the emitter and the collector is sufficiently small. At this time, the third switch 40 is in the ON state and a current can flow via the emitter and the collector. In the third switch 40, when the voltage at the base relative to the potential at the emitter is greater than or equal to the third voltage threshold value, the value of a resistance between the emitter and the collector is sufficiently large. At this time, the third switch 40 is in the OFF state and a current does not flow via the emitter and the collector. The third voltage threshold value is a negative constant value that is set in advance. The third voltage threshold value corresponds to a third threshold value.

In the following, the voltage at the direct current power source 10 relative to the potential at the ground conductor 16 will be referred to as a "power supply voltage". The regulator 29 reduces the power supply voltage to a target voltage and applies the target voltage to the microcomputer 30. Thus, power is supplied to the microcomputer 30. The power supply voltage is 12 V for example. The target voltage is 5 V, for example. When power is supplied to the microcomputer 30, a current flows from the positive electrode of the direct current power source 10 to the regulator 29, the microcomputer 30, the first conducting wire 14, and the ground conductor 16 in this order.

The microcomputer 30 outputs a control signal constituted by a high level voltage and a low level voltage via the second switch resistor 28 to a control terminal of the second switch 26. Each of the high level voltage and the low level voltage is a voltage relative to the potential at the emitter of the second switch 26. The high level voltage is higher than the low level voltage. The low level voltage is 0 V, for example. The microcomputer 30 turns the MOSFET 20 ON or OFF by switching the voltage of the control signal. The microcomputer 30 functions as an output unit.

As described above, the current flowing through the first conducting wire 14 varies when the plurality of electrical devices operate or stop operation. When the current flowing through the first conducting wire 14 varies, the potential at the emitter of the second switch 26, i.e., the voltage at the one end of the first conducting wire 14 relative to the potential at the ground conductor 16 varies.

As described above, when a current due to noise flows through the first conducting wire 14 or a contact resistance of the first conducting wire 14 at the ground conductor 16 increases as well, the current flowing through the first conducting wire 14 varies and the voltage at the one end of the first conducting wire 14 relative to the potential at the ground conductor 16 varies.

Figure 3:
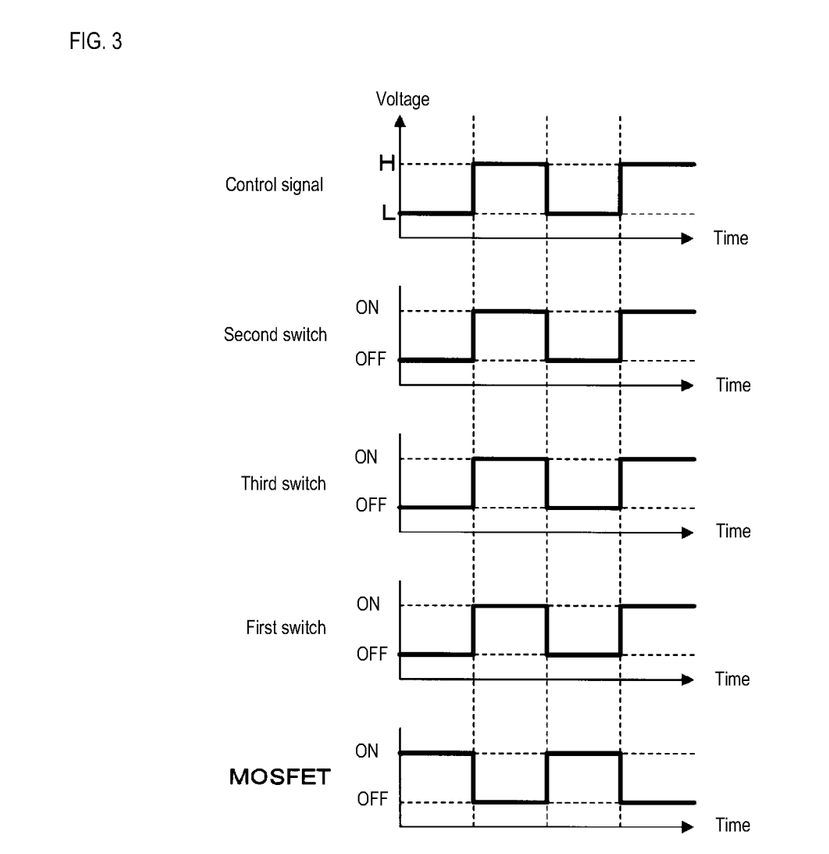
FIG. 3 is a timing chart showing switching of a MOSFET.

FIG. 3 is a timing chart showing switching of the MOSFET 20. In FIG. 3, the high level voltage is denoted by "H" and the low level voltage is denoted by "L". A graph of the voltage of the control signal and graphs of the states of the second switch 26, the third switch 40, the first switch 22, and the MOSFET 20 are shown. In these graphs, time is shown on the horizontal axis.

When the voltage of the control signal is greater than 0 V a current flows from the microcomputer 30 to the second switch resistors 28 and 27 in this order, and returns to the microcomputer 30. The microcomputer 30 switches the voltage of the control signal from the high level voltage to the low level voltage to drive the load 13. When the voltage of the control signal is the low level voltage, the current flowing through the second switch resistors is sufficiently small or 0 A. Accordingly, in the second switch 26, the voltage at the base relative to the potential at the emitter is sufficiently low or 0 V, and is less than the second voltage threshold value. Therefore, the second switch 26 is turned OFF.

When the second switch 26 is turned OFF, a current does not flow through the third switch resistors 41 and 42. Accordingly, in the third switch 40, the voltage at the base relative to the potential at the emitter is 0 V, and is greater than or equal to the third voltage threshold value. Therefore, the third switch 40 is turned OFF.

When the third switch 40 is turned OFF, a current does not flow through the first switch resistors 23 and 24. Accordingly, in the first switch 22, the voltage at the base relative to the potential at the emitter is 0 V, and is less than the first voltage threshold value. Therefore, the first switch 22 is turned OFF. Accordingly, when the second switch 26 is turned OFF, the switching circuit 25 turns the first switch 22 OFF.

When the first switch 22 is turned OFF, a current does not flow through the circuit resistor 21, and accordingly, the voltage at the gate relative to the potential at the ground conductor 16 is the power supply voltage. When a current due to noise flows through the second conducting wire 15 or a contact resistance of the second conducting wire 15 at the ground conductor 16 increases, the voltage at the one end of the second conducting wire 15, i.e., the voltage at the source of the MOSFET 20 relative to the potential at the ground conductor 16 varies. The power supply voltage is sufficiently larger than the maximum value of the voltage at the source of the MOSFET 20 relative to the potential at the ground conductor 16. The difference between the maximum value and the power supply voltage is greater than or equal to the gate threshold value. Accordingly, when the first switch 22 is turned OFF, in the MOSFET 20, the voltage at the gate relative to the potential at the source is greater than or equal to the gate threshold value, and the MOSFET 20 is turned ON.

When the MOSFET 20 is turned ON, a current flows from the positive electrode of the direct current power source 10 through the load 13, the MOSFET 20, the second conducting wire 15, and the ground conductor 16 in this order, and returns to the negative electrode of the direct current power source 10. Thus, power is supplied to the load 13 and the load 13 operates. At this time, the current is input to the drain of the MOSFET 20 and is output from the source of the MOSFET 20.

The current path of the current flowing from the positive electrode of the direct current power source 10 through the load 13, the MOSFET 20, the second conducting wire 15, and the ground conductor 16 in this order is the current path of a current flowing via the load 13. The MOSFET 20 is disposed downstream of the load 13 on the current path.

The microcomputer 30 switches the voltage of the control signal from the low level voltage to the high level voltage to stop operation of the load 13. When the voltage of the control signal is the high level voltage, a current that flows through the second switch resistors 28 and 27 in this order is sufficiently large. Accordingly, when the voltage of the control signal is the high level voltage, in the second switch 26, the voltage at the base relative to the potential at the emitter is greater than or equal to the second voltage threshold value, and the second switch 26 is turned ON.

When the second switch 26 is turned ON, a current flows from the positive electrode of the direct current power source 10 through the third switch resistors 41 and 42, the second switch 26, the first conducting wire 14, and the ground conductor 16 in this order, and returns to the negative electrode of the direct current power source 10. At this time, a voltage drop occurs in the third switch resistor 41, and in the third switch 40, the voltage at the base relative to the potential at the emitter is less than the third voltage threshold value. Consequently, the third switch 40 is turned ON when the second switch 26 is turned ON.

When the second switch 26 is turned ON, a current is input to the collector of the second switch 26 and is output from the emitter of the second switch 26. The collector, the emitter, and the base of the second switch 26 function as an input terminal, an output terminal, and a control terminal, respectively.

When the third switch 40 is turned ON, a current flows from the positive electrode of the direct current power source 10 to the third switch 40, the first switch resistors 24 and 23, the second conducting wire 15, and the ground conductor 16 in this order, and returns to the negative electrode of the direct current power source 10. At this time, a voltage drop occurs in the first switch resistor 23, and in the first switch 22, the voltage at the base relative to the potential at the emitter is greater than or equal to the first voltage threshold value. Consequently, the first switch 22 is turned ON when the third switch 40 is turned ON. The switching circuit 25 turns the first switch 22 ON when the second switch 26 is turned ON.

As described above, the power supply voltage is sufficiently larger than the maximum value of the voltage at the source of the MOSFET 20, i.e., the voltage at the emitter of the first switch 22 relative to the potential at the ground conductor 16. Accordingly, a current flowing through the first switch resistor 23 is large, and the voltage drop across the first switch resistor 23 is greater than or equal to the first voltage threshold value. Therefore, the first switch 22 is reliably turned ON when the third switch 40 is turned ON.

When the third switch 40 is turned ON, a current is input to the emitter of the third switch 40 and is output from the collector of the third switch 40. The emitter, the collector, and the base of the third switch 40 function as an input terminal, an output terminal, and a control terminal, respectively.

When the first switch 22 is turned ON, in the MOSFET 20, the voltage at the gate relative to the potential at the source is 0 V and is less than the gate threshold value. Therefore, when the first switch 22 is turned ON, the MOSFET 20 is turned OFF.

As described above, when the voltage of the control signal is the low level voltage, i.e., when the microcomputer 30 outputs the low level voltage to the gate of the second switch 26, the MOSFET 20 is turned ON. When the voltage of the control signal is the high level voltage, i.e., when the microcomputer 30 outputs the high level voltage to the gate of the second switch 26, the MOSFET 20 is turned OFF.

When the first switch 22 is turned ON, a current flows from the positive electrode of the direct current power source 10 through the circuit resistor 21, the first switch 22, the second conducting wire 15, and the ground conductor 16 in this order, and returns to the negative electrode of the direct current power source 10. When the first switch 22 is turned ON, the current is input to the collector of the first switch 22 and is output from the emitter of the first switch 22. The collector, the emitter, and the base of the first switch 22 function as an input terminal, an output terminal, and a control terminal, respectively.

When the first conducting wire 14 breaks or the connection between the driving apparatus 11 and the ground conductor 16 via the first conducting wire 14 is cut off, the emitter of the second switch 26 is opened. In this case, a current does not flow to the second switch resistor 27, and accordingly, in the second switch 26, the voltage at the base relative to the potential at the emitter is 0 V, and is less than the second voltage threshold value. At this time, the second switch 26 is turned OFF. As described above, when the second switch 26 is turned OFF, the third switch 40 and the first switch 22 are turned OFF and the MOSFET 20 is turned ON. Therefore, when the emitter of the second switch 26 is opened, the MOSFET 20 is kept in the ON state.

Effects of Driving Apparatus 11

The high level voltage and the low level voltage output from the microcomputer 30 to the second switch 26 are voltages relative to the potential at the emitter of the second switch 26. The second switch 26 is turned ON or OFF according to the voltage at the base relative to the potential at the emitter. Therefore, the second switch 26 is correctly turned ON or OFF even when the reference potential for the high level voltage and the low level voltage, i.e., the voltage at the emitter of the second switch 26 relative to the potential at the ground conductor 16 varies.

Also, the power supply voltage of the direct current power source 10 is sufficiently higher than the maximum value of the voltage at the one end of the first conducting wire 14 relative to the potential at the ground conductor 16. Accordingly, when the second switch 26 is turned ON, a sufficiently large current flows through the third switch resistor 41, and in the third switch 40, the voltage at the base relative to the potential at the emitter is less than the third voltage threshold value. Consequently, when the second switch 26 is turned ON, the third switch 40 is turned ON irrespective of the voltage at the one end of the first conducting wire 14 relative to the potential at the ground conductor 16. As described above, when the third switch 40 is turned ON, the first switch 22 is turned ON and the MOSFET 20 is turned OFF.

When the second switch 26 is turned OFF, the flow of a current via the third switch resistor 41 stops and the third switch 40 is turned OFF irrespective of the voltage at the one end of the first conducting wire 14 relative to the potential at the ground conductor 16. As described above, when the third switch 40 is turned OFF, the first switch 22 is turned OFF and the MOSFET 20 is turned ON.

As described above, when the second switch 26 is switched correctly, the MOSFET 20 is also switched correctly. Consequently, the MOSFET 20 is turned ON or OFF correctly even when the reference potential for the voltage of the control signal, i.e., the voltage at the one end of the first conducting wire 14 relative to the potential at the ground conductor 16 varies.

Notes

The MOSFET 20 is only required to be a switch that is turned ON when the voltage at the control terminal relative to the potential at the output terminal from which a current is output is increased. Therefore, it is also possible to use an N-channel FET other than the MOSFET, an IGBT (Insulated Gate Bipolar Transistor), an NPN bipolar transistor, or the like, instead of the MOSFET 20.

Embodiment 2

In Embodiment 1, a single switch is used to control power supply to the load 13. However, the number of switches used to control power supply to the load 13 is not limited to one, and may also be two or more.

The following describes aspects of Embodiment 2 that differ from Embodiment 1. Configurations other than configurations described below are the same as those in Embodiment 1. Accordingly, constitutional units that are the same as those in Embodiment 1 are denoted by the same reference numerals as those used in Embodiment 1, and descriptions thereof are omitted.

Outline of Driving Apparatus 11

Figure 4:
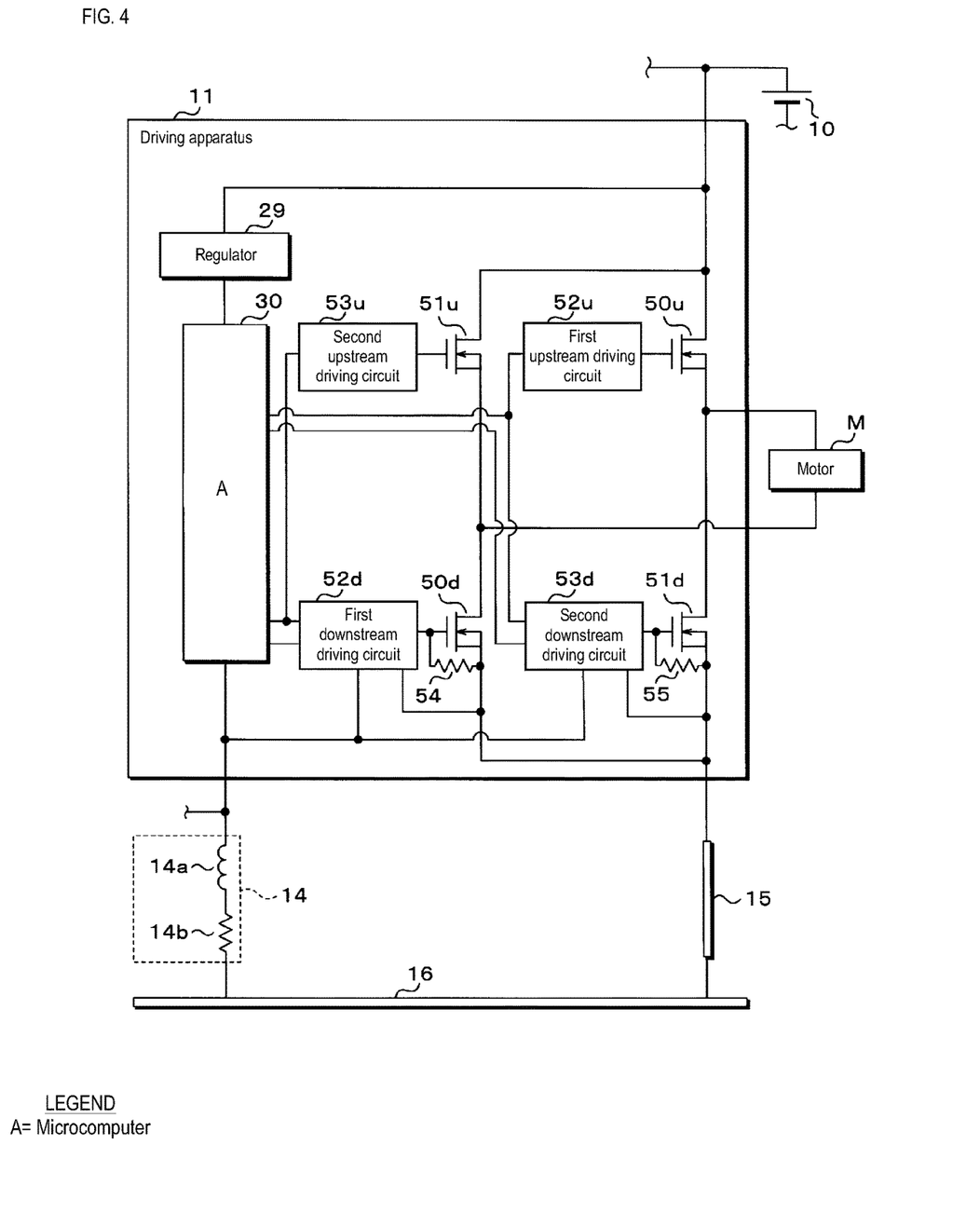
FIG. 4 is a block diagram showing the configuration of a main portion of a driving apparatus in Embodiment 2.

FIG. 4 is a block diagram showing the configuration of a main portion of the driving apparatus 11 in Embodiment 2. In the power supply system 1 of Embodiment 2, the driving apparatus 11 drives a motor M, which is the load 13. Similarly to Embodiment 1, the power supply system 1 of Embodiment 2 does not necessarily have to include the electrical devices 12. The driving apparatus 11 includes a first upstream switch 50u, a first downstream switch 50d, a second upstream switch 51u, and a second downstream switch 51d. A first current path and a second current path are provided as current paths for a current that flows from the positive electrode of the direct current power source 10 through the motor M.

In the first current path, the first upstream switch 50u is disposed upstream of the motor M and the first downstream switch 50d is disposed downstream of the motor M. In the second current path, the second upstream switch 51u is disposed upstream of the motor M and the second downstream switch 51d is disposed downstream of the motor M. The direction in which a current flows through the motor M when flowing through the first current path is a first direction, which is the downward direction in FIG. 4. The direction in which a current flows through the motor M when flowing through the second current path is a second direction, which is the upward direction in FIG. 4. The first direction differs from the second direction.

The driving apparatus 11 turns the first upstream switch 50u and the first downstream switch 50d ON in a state where the second upstream switch 51u and the second downstream switch 51d are turned OFF. As a result, a current flows through the motor M in the first direction and the motor M rotates in a forward direction. The motor M includes a rotor that has a solid cylindrical shape. Rotation of the motor M refers to rotation of the rotor about its axis. The forward direction is the clockwise direction, for example.

The driving apparatus 11 turns the second upstream switch 51u and the second downstream switch 51d ON in a state where the first upstream switch 50u and the first downstream switch 50d are turned OFF. As a result, a current flows through the motor M in the second direction and the motor M rotates in the reverse direction. When the forward direction is the clockwise direction, the reverse direction is the counterclockwise direction.

The motor M is used to open or close a window of the vehicle, for example. When the motor M rotates in the forward direction, the window of the vehicle is opened, for example. When the motor M rotates in the reverse direction, the window of the vehicle is closed, for example.

The driving apparatus 11 turns the first upstream switch 50u and the second upstream switch 51u OFF. As a result, power supply from the direct current power source 10 to the motor M stops and the motor M stops operation.

Configuration of Driving Apparatus 11

As shown in FIG. 4, the driving apparatus 11 includes the regulator 29, the microcomputer 30, a first upstream driving circuit 52u, a first downstream driving circuit 52d, a second upstream driving circuit 53u, a second downstream driving circuit 53d, and switch resistors 54 and 55, in addition to the first upstream switch 50u, the first downstream switch 50d, the second upstream switch 51u, and the second downstream switch 51d. The first upstream switch 50u, the first downstream switch 50d, the second upstream switch 51u, and the second downstream switch 51d are N-channel MOSFETs.

The direct current power source 10, the regulator 29, the microcomputer 30, the first conducting wire 14, and the ground conductor 16 are connected in the same manner as in Embodiment 1. A plurality of electrical devices 12 are connected to one end of the first conducting wire 14. The drain of the first upstream switch 50u is connected to the positive electrode of the direct current power source 10. The source of the first upstream switch 50u is connected to one end of the motor M. The other end of the motor M is connected to the drain of the first downstream switch 50d. The source of the first downstream switch 50d is connected to the ground conductor 16 via the second conducting wire 15. The switch resistor 54 is connected between the gate and the source of the first downstream switch 50d.

The drain of the second upstream switch 51u is connected to the positive electrode of the direct current power source 10. The source of the second upstream switch 51u is connected to a connection node between the first downstream switch 50d and the motor M. A connection node between the first upstream switch 50u and the motor M is connected to the drain of the second downstream switch 51d. The source of the second downstream switch 51d is connected to the ground conductor 16 via the second conducting wire 15. The switch resistor 55 is connected between the gate and the source of the second downstream switch 51d.

The gates of the first upstream switch 50u, the first downstream switch 50d, the second upstream switch 51u, and the second downstream switch 51d are respectively connected to the first upstream driving circuit 52u, the first downstream driving circuit 52d, the second upstream driving circuit 53u, and the second downstream driving circuit 53d. The first upstream driving circuit 52u is connected to the microcomputer 30. A connection node between the first upstream driving circuit 52u and the microcomputer 30 is connected to the second downstream driving circuit 53d. The second upstream driving circuit 53u is connected to the microcomputer 30. A connection node between the second upstream driving circuit 53u and the microcomputer 30 is connected to the first downstream driving circuit 52d.

The microcomputer 30 is further directly connected to the first downstream driving circuit 52d and the second downstream driving circuit 53d. The first downstream driving circuit 52d and the second downstream driving circuit 53d are connected to a connection node between the microcomputer 30 and the first conducting wire 14. The first downstream driving circuit 52d is further connected to the source of the first downstream switch 50d. The second downstream driving circuit 53d is further connected to the source of the second downstream switch 51d.

The first downstream driving circuit 52d and the second downstream driving circuit 53d are connected to the positive electrode of the direct current power source 10. Connection lines of these connections are omitted in FIG. 4 to avoid complication of the drawing.

Operation of Driving Apparatus 11

In each of the first upstream switch 50u, the first downstream switch 50d, the second upstream switch 51u, and the second downstream switch 51d, when the voltage at the gate relative to the potential at the source is greater than or equal to a switch threshold value, the value of a resistance between the drain and the source is sufficiently small. At this time, the first upstream switch 50u, the first downstream switch 50d, the second upstream switch 51u, and the second downstream switch 51d are in the ON state, and a current can flow via the drain and the source.

In each of the first upstream switch 50u, the first downstream switch 50d, the second upstream switch 51u, and the second downstream switch 51d, when the voltage at the gate relative to the potential at the source is less than the switch threshold value, the value of a resistance between the drain and the source is sufficiently large. At this time, the first upstream switch 50u, the first downstream switch 50d, the second upstream switch 51u, and the second downstream switch 51d are in the OFF state, and a current does not flow via the drain and the source. The switch threshold value is a positive constant value that is set in advance. The switch threshold values of the first upstream switch 50u, the first downstream switch 50d, the second upstream switch 51u, and the second downstream switch 51d may be the same as each other or differ from each other.

The microcomputer 30 outputs a right side control signal to the first upstream driving circuit 52u and the second downstream driving circuit 53d. The microcomputer 30 outputs a left side control signal to the second upstream driving circuit 53u and the first downstream driving circuit 52d. The right side control signal and the left side control signal are each constituted by a high level voltage and a low level voltage. The microcomputer 30 switches each of the voltage of the right side control signal and the voltage of the left side control signal to the high level voltage or the low level voltage. The first upstream driving circuit 52u and the second downstream driving circuit 53d are turned ON or OFF depending on the voltage of the right side control signal. The second upstream driving circuit 53u and the first downstream driving circuit 52d are turned ON or OFF depending on the voltage of the left side control signal.

Figure 5:
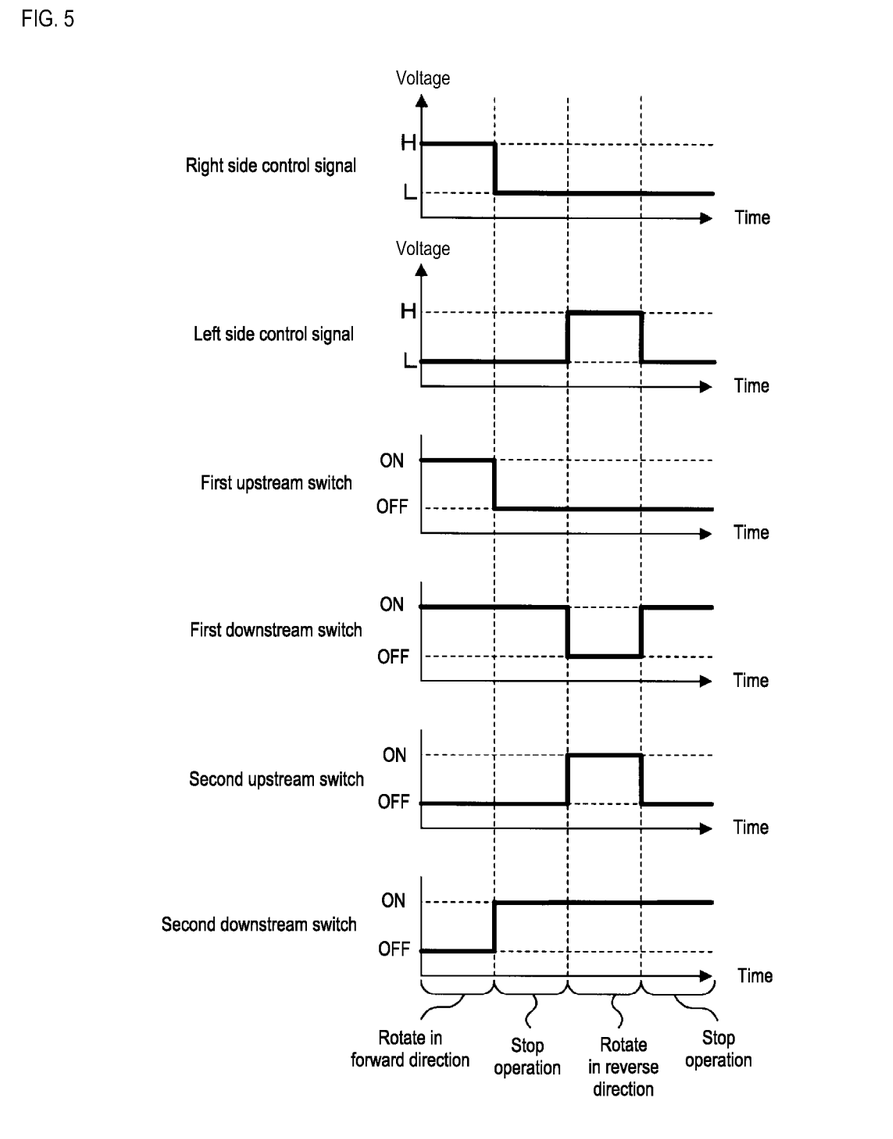
FIG. 5 is a timing chart showing operations of the driving apparatus.

FIG. 5 is a timing chart showing operations of the driving apparatus 11. In FIG. 5 as well, the high level voltage is denoted by "H" and the low level voltage is denoted by "L". Graphs of the right side control signal and the left side control signal and graphs of the states of the first upstream switch 50u, the first downstream switch 50d, the second upstream switch 51u, and the second downstream switch 51d are shown. In these graphs, time is shown on the horizontal axis.

There are three states of the voltages of the right side control signal and the left side control signal. A first state is a state in which the voltage of the right side control signal is the high level voltage and the voltage of the left side control signal is the low level voltage. A second state is a state in which the voltage of the right side control signal is the low level voltage and the voltage of the left side control signal is the high level voltage. A third state is a state in which the voltage of the right side control signal and the voltage of the left side control signal are the low level voltage.

When the right side control signal is switched from the low level voltage to the high level voltage, the first upstream driving circuit 52u increases the voltage at the gate of the first upstream switch 50u relative to the potential at the ground conductor 16. As a result, in the first upstream switch 50u, the voltage at the gate relative to the potential at the source becomes greater than or equal to the switch threshold value, and the first upstream switch 50u is turned ON. In the same case, the second downstream driving circuit 53d reduces the voltage at the gate of the second downstream switch 51d relative to the potential at the source of the second downstream switch 51d to 0 V. As a result, in the second downstream switch 51d, the voltage at the gate relative to the potential at the source becomes less than the switch threshold value, and the second downstream switch 51d is turned OFF. Therefore, when the voltage of the right side control signal is the high level voltage, the first upstream switch 50u is in the ON state and the second downstream switch 51d is in the OFF state.

When the left side control signal is switched from the high level voltage to the low level voltage, the second upstream driving circuit 53u reduces the voltage at the gate of the second upstream switch 51u relative to the potential at the ground conductor 16. As a result, in the second upstream switch 51u, the voltage at the gate relative to the potential at the source becomes less than the switch threshold value, and the second upstream switch 51u is turned OFF. In the same case, the first downstream driving circuit 52d increases the voltage at the gate of the first downstream switch 50d relative to the potential at the source of the first downstream switch 50d. As a result, in the first downstream switch 50d, the voltage at the gate relative to the potential at the source becomes greater than or equal to the switch threshold value, and the first downstream switch 50d is turned ON. Therefore, when the voltage of the left side control signal is the low level voltage, the second upstream switch 51u is in the OFF state and the first downstream switch 50d is in the ON state.

When the voltage of the right side control signal is the high level voltage and the voltage of the left side control signal is the low level voltage, the first upstream switch 50u and the first downstream switch 50d are in the ON state and the second upstream switch 51u and the second downstream switch 51d are in the OFF state. At this time, a current flows from the positive electrode of the direct current power source 10 through the first upstream switch 50u, the motor M, the first downstream switch 50d, the second conducting wire 15, and the ground conductor 16 in this order, and returns to the negative electrode of the direct current power source 10. As a result, the current flows through the motor M in the first direction and the motor M rotates in the forward direction.

When the first upstream switch 50u and the first downstream switch 50d are in the ON state, in each of the first upstream switch 50u and the first downstream switch 50d, a current is input to the drain and is output from the source.

When the right side control signal is switched from the high level voltage to the low level voltage, the first upstream driving circuit 52u reduces the voltage at the gate of the first upstream switch 50u relative to the potential at the ground conductor 16. As a result, in the first upstream switch 50u, the voltage at the gate relative to the potential at the source becomes less than the switch threshold value, and the first upstream switch 50u is turned OFF. In the same case, the second downstream driving circuit 53d increases the voltage at the gate of the second downstream switch 51d relative to the potential at the source of the second downstream switch 51d. As a result, in the second downstream switch 51d, the voltage at the gate relative to the potential at the source becomes greater than or equal to the switch threshold value, and the second downstream switch 51d is turned ON. Therefore, when the voltage of the right side control signal is the low level voltage, the first upstream switch 50u is in the OFF state and the second downstream switch 51d is in the ON state.

When the left side control signal is switched from the low level voltage to the high level voltage, the second upstream driving circuit 53u increases the voltage at the gate of the second upstream switch 51u relative to the potential at the ground conductor 16. As a result, in the second upstream switch 51u, the voltage at the gate relative to the potential at the source becomes greater than or equal to the switch threshold value, and the second upstream switch 51u is turned ON. In the same case, the first downstream driving circuit 52d reduces the voltage at the gate of the first downstream switch 50d relative to the potential at the source of the first downstream switch 50d to 0 V As a result, in the first downstream switch 50d, the voltage at the gate relative to the potential at the source becomes less than the switch threshold value, and the first downstream switch 50d is turned OFF. Therefore, when the voltage of the left side control signal is the high level voltage, the second upstream switch 51u is in the ON state and the first downstream switch 50d is in the OFF state.

When the voltage of the right side control signal is the low level voltage and the voltage of the left side control signal is the high level voltage, the first upstream switch 50u and the first downstream switch 50d are in the OFF state and the second upstream switch 51u and the second downstream switch 51d are in the ON state. At this time, a current flows from the positive electrode of the direct current power source 10 to the second upstream switch 51u, the motor M, the second downstream switch 51d, the second conducting wire 15, and the ground conductor 16 in this order, and returns to the negative electrode of the direct current power source 10. As a result, the current flows through the motor M in the second direction and the motor M rotates in the reverse direction.

When the second upstream switch 51u and the second downstream switch 51d are in the ON state, in each of the second upstream switch 51u and the second downstream switch 51d, a current is input to the drain and is output from the source.

When the voltage of the right side control signal and the voltage of the left side control signal are the low level voltage, the first upstream switch 50u and the second upstream switch 51u are in the OFF state and the first downstream switch 50d and the second downstream switch 51d are in the ON state. Since the first upstream switch 50u and the second upstream switch 51u are in the OFF state, power is not supplied to the motor M, and the motor M stops operation.

The motor M includes an inductor (not shown). While power is supplied to the motor M, a current flows through the inductor, and energy is accumulated in the inductor. When the first downstream switch 50d and the second downstream switch 51d are in the ON state, a current flows from one end of the motor M via the first downstream switch 50d and the second downstream switch 51d, and the motor M releases energy. As shown in FIG. 5, when the direction in which the motor M rotates is to be changed, operation of the motor M is once stopped to make the motor M release energy.

Configuration of First Downstream Driving Circuit 52d

Figure 6:
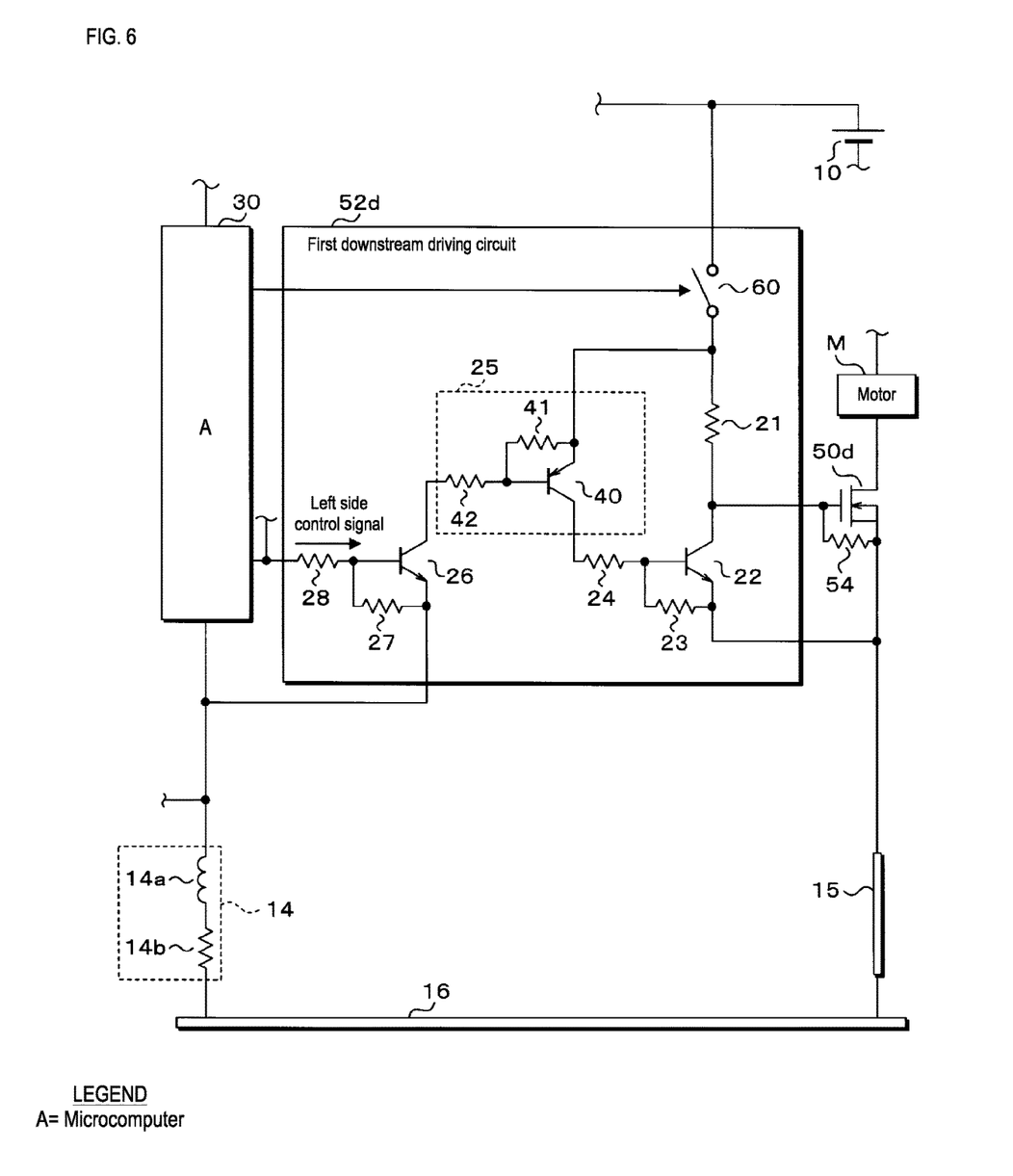
FIG. 6 is a circuit diagram of a first downstream driving circuit.

FIG. 6 is a circuit diagram of the first downstream driving circuit 52d. The first downstream driving circuit 52d includes the circuit resistor 21, the first switch 22, the first switch resistors 23 and 24, the switching circuit 25, the second switch 26, the second switch resistors 27 and 28, and a circuit switch 60. The switching circuit 25 in Embodiment 2 includes the third switch 40 and the third switch resistors 41 and 42 similarly to Embodiment 1. The circuit resistor 21, the first switch 22, the first switch resistors 23 and 24, the switching circuit 25, the second switch 26, the second switch resistors 27 and 28, the third switch 40, and the third switch resistors 41 and 42 are connected in the same manner as in Embodiment 1.

One end of the circuit switch 60 is connected to the positive electrode of the direct current power source 10. The other end of the circuit switch 60 is connected to a connection node between the circuit resistor 21 and the emitter of the third switch 40. A connection node between the circuit resistor 21 and the collector of the first switch 22 is connected to the gate of the first downstream switch 50d. The emitter of the first switch 22 is connected to the source of the first downstream switch 50d.

Similarly to Embodiment 1, the base of the second switch 26 is connected to the microcomputer 30 via the second switch resistor 28, and the emitter of the second switch 26 is connected to the one end of the first conducting wire 14.

As described above, the circuit resistor 21 is connected between the positive electrode of the direct current power source 10 and the gate of the first downstream switch 50d. The first switch 22 is connected between the gate and the source of the first downstream switch 50d.

Operation of First Downstream Driving Circuit 52d

The microcomputer 30 turns the circuit switch 60 ON or OFF. The microcomputer 30 outputs the left side control signal to the base of the second switch 26. The high level voltage and the low level voltage of the left side control signal are voltages relative to the emitter of the second switch 26. Accordingly, when the circuit switch 60 is turned ON, the second switch 26, the third switch 40, and the first switch 22 are turned ON or OFF according to the voltage of the left side control signal.

When the circuit switch 60 is turned ON and the voltage of the left side control signal is the low level voltage, the second switch 26, the third switch 40, and the first switch 22 are turned OFF similarly to Embodiment 1. When the first switch 22 is turned OFF, a current flows from the positive electrode of the direct current power source 10 to the circuit resistor 21, the switch resistor 54, the second conducting wire 15, and the ground conductor 16 in this order, and returns to the negative electrode of the direct current power source 10. Voltage drop occurs in the switch resistor 54. At this time, in the first downstream switch 50d, the voltage at the gate relative to the potential at the source is greater than or equal to the switch threshold value, and the first downstream switch 50d is turned ON. The power supply voltage is sufficiently larger than the maximum value of the voltage at the source of the first downstream switch 50d relative to the potential at the ground conductor 16. Accordingly, the voltage drop across the switch resistor 54 is greater than or equal to the switch threshold value. Therefore, the first downstream switch 50d is reliably turned ON when the first switch 22 is turned OFF.

When the circuit switch 60 is turned ON and the voltage of the left side control signal is the high level voltage, the second switch 26, the third switch 40, and the first switch 22 are turned ON similarly to Embodiment 1. When the first switch 22 is turned ON, in the first downstream switch 50d, the voltage at the gate relative to the potential at the source is 0 V and is less than the switch threshold value. Consequently, the first downstream switch 50d is turned OFF. Similarly to Embodiment 1, the power supply voltage is sufficiently larger than the maximum value of the voltage at the emitter of the first switch 22 relative to the potential at the ground conductor 16. Accordingly, when the second switch 26 is turned ON, the voltage drop across the first switch resistor 23 is greater than or equal to the first voltage threshold value. Therefore, the first switch 22 is reliably turned ON when the third switch 40 is turned ON.

As described above, in the case where the circuit switch 60 is turned ON, the first downstream switch 50d is turned ON when the voltage of the left side control signal is the low level voltage as shown in FIG. 5. In the same case, the first downstream switch 50d is turned OFF when the voltage of the left side control signal is the high level voltage.

In the case where the circuit switch 60 is turned OFF, a current does not flow to the switch resistor 54 irrespective of whether the second switch 26 is ON or OFF, i.e., irrespective of the voltage of the left side control signal. Accordingly, when the circuit switch 60 is turned OFF, in the first downstream switch 50d, the voltage at the gate relative to the potential at the source is 0 V and is less than the switch threshold value. Therefore, the first downstream switch 50d is turned OFF.

Therefore, the microcomputer 30 can turn the second upstream switch 51u and the first downstream switch 50d OFF by switching the voltage of the left side control signal to the low level voltage and turning the circuit switch 60 OFF.

Second Downstream Driving Circuit 53d

The second downstream driving circuit 53d is configured similarly to the first downstream driving circuit 52d. Connections in the second downstream driving circuit 53d can be described by replacing the first downstream switch 50d with the second downstream switch 51d in the description of connections in the first downstream driving circuit 52d.

Operations of the second downstream driving circuit 53d are the same as the operations of the first downstream driving circuit 52d. Operations of the second downstream driving circuit 53d can be described by replacing the left side control signal, the first downstream switch 50d, and the switch resistor 54 with the right side control signal, the second downstream switch 51d, and the switch resistor 55, respectively, in the description of the operations of the first downstream driving circuit 52d. The voltage of the right side control signal is a voltage relative to the potential at the emitter of the second switch 26 included in the second downstream driving circuit 53d.

Accordingly, in the case where the circuit switch 60 is turned ON, the second downstream switch 51d is turned ON when the voltage of the right side control signal is the low level voltage. In the same case, the second downstream switch 51d is turned OFF when the voltage of the right side control signal is the high level voltage. The microcomputer 30 can turn the first upstream switch 50u and the second downstream switch 51d OFF by switching the voltage of the right side control signal to the low level voltage and turning the circuit switch 60 included in the second downstream driving circuit 53d OFF.

The microcomputer 30 switches the voltage of the right side control signal and the voltage of the left side control signal to the low level voltage and turns the circuit switches 60 in the first downstream driving circuit 52d and the second downstream driving circuit 53d OFF. Thus, it is possible to realize a state in which the first upstream switch 50u, the first downstream switch 50d, the second upstream switch 51u, and the second downstream switch 51d are turned OFF.

When the emitters of the second switches 26 in the first downstream driving circuit 52d and the second downstream driving circuit 53d are opened while the circuit switches 60 are turned ON, the second switches 26 are turned OFF, and consequently, the first downstream switch 50d and the second downstream switch 51d are turned ON. As a result, voltages at both ends of the motor M match and the motor M stops operation.

Effects of Driving Apparatus 11

The driving apparatus 11 in Embodiment 2 has the same effects as the effects of the driving apparatus 11 in Embodiment 1. Therefore, in the case where the circuit switches 60 are turned ON, the first downstream switch 50d and the second downstream switch 51d are correctly turned ON or OFF even when the reference potential for the voltages of the right side control signal and the left side control signal, i.e., the voltage at the one end of the first conducting wire 14 relative to the potential at the ground conductor 16 varies. In the case where the circuit switches 60 are turned OFF, the first downstream switch 50d and the second downstream switch 51d are turned OFF irrespective of the voltage at the one end of the first conducting wire 14 relative to the potential at the ground conductor 16.

Notes

In Embodiment 2, each of the first upstream switch 50u and the second upstream switch 51u is only required to function as a switch, and is not limited to the N-channel MOSFET, and may also be an N-channel FET other than the MOSFET, a P-channel FET, an IGBT, a bipolar transistor, a relay contact, or the like. Each of the first downstream switch 50*d* and the second downstream switch 51*d* is only required to be a switch that is turned ON when the voltage at the control terminal relative to the potential at the output terminal from which a current is output is increased. Accordingly, each of the first downstream switch 50*d* and the second downstream switch 51*d* is not limited to the N-channel MOSFET, and may also be an N-channel FET other than the MOSFET, an IGBT, an NPN bipolar transistor, or the like. In Embodiment 2, the load driven by the driving apparatus 11 is not limited to the motor M and is only required to be an electrical device that switches the application direction of a direct current voltage.

In Embodiment 1, a resistor may be connected between the gate and the source of the MOSFET 20 similarly to Embodiment 2. In this case, when the first switch 22 is turned OFF, a current flows from the positive electrode of the direct current power source 10 to the circuit resistor 21, the resistor, and the ground conductor 16 in this order, and returns to the negative electrode of the direct current power source 10. Voltage drop occurs in the resistor, and accordingly, in the MOSFET 20, the voltage at the gate relative to the potential at the source is greater than or equal to the gate threshold value, and the MOSFET 20 is turned ON.

In Embodiments 1 and 2, each of the first switch 22 and the second switch 26 is only required to be a switch that is turned ON when the voltage at the control terminal relative to the potential at the output terminal from which a current is output is increased. Accordingly, each of the first switch 22 and the second switch 26 is not limited to the NPN bipolar transistor, and may also be an N-channel FET, an IGBT, or the like.

In Embodiments 1 and 2, the third switch 40 is only required to be a switch that is turned ON when the voltage at the control terminal relative to the potential at the output terminal from which a current is output is reduced. Accordingly, the third switch 40 is not limited to the PNP bipolar transistor, and may also be a P-channel FET, for example. The number of electrical devices 12 included in the power supply systems 1 in Embodiments 1 and 2 is not limited to two or more, and may also be one.

Embodiments 1 and 2 disclosed herein are examples in all aspects and should not be construed as limiting the invention. The scope of the present invention is not limited by the above description but is indicated by the claims, and all modifications that fall within the meaning and range of equivalency with the claims are intended to be encompassed therein.

The invention claimed is:

1. A driving apparatus for driving a load, comprising:
an N-channel MOSFET that is disposed downstream of the load on a current path of a current that flows via the load;
a resistor that is connected between a direct current power source and the gate of the MOSFET;
a first switch that is connected between the gate and the source of the MOSFET;
a second switch that is turned ON when a voltage at a control terminal relative to a potential at an output terminal from which a current is output is greater than or equal to a threshold value;
a switching circuit connected to the direct current power source and interposed between the second switch and the first switch, the switching circuit configured to turn the first switch ON when the second switch is turned ON and turn the first switch OFF when the second switch is turned OFF by processing the direct current power source; and
an output unit configured to output a voltage relative to the potential at the output terminal of the second switch to the control terminal of the second switch.

2. The driving apparatus according to claim 1, wherein the output terminal of the second switch is connected to a ground conductor via a first conducting wire, and
the source of the MOSFET is connected to the ground conductor via a second conducting wire.

3. The driving apparatus according to claim 1, wherein the first switch is turned ON when a voltage at a control terminal relative to a potential at an output terminal from which a current is output is greater than or equal to a second threshold value,
the driving apparatus further includes a second resistor that is connected between the control terminal and the output terminal of the first switch,
an input terminal of the first switch to which a current is input is connected to the gate of the MOSFET,
the output terminal of the first switch is connected to the source of the MOSFET,
the switching circuit includes:
a third switch that is turned ON when a voltage at a control terminal relative to a potential at an input terminal to which a current is input is less than a third threshold value; and
a third resistor that is connected between the control terminal and the input terminal of the third switch,
the input terminal of the third switch is connected to the direct current power source,
an output terminal of the third switch from which a current is output is connected to the control terminal of the first switch, and
the control terminal of the third switch is connected to an input terminal of the second switch to which a current is input.

4. The driving apparatus according to claim 2, wherein the first switch is turned ON when a voltage at a control terminal relative to a potential at an output terminal from which a current is output is greater than or equal to a second threshold value,
the driving apparatus further includes a second resistor that is connected between the control terminal and the output terminal of the first switch,
an input terminal of the first switch to which a current is input is connected to the gate of the MOSFET,
the output terminal of the first switch is connected to the source of the MOSFET,
the switching circuit includes:
a third switch that is turned ON when a voltage at a control terminal relative to a potential at an input terminal to which a current is input is less than a third threshold value; and
a third resistor that is connected between the control terminal and the input terminal of the third switch,
the input terminal of the third switch is connected to the direct current power source,
an output terminal of the third switch from which a current is output is connected to the control terminal of the first switch, and
the control terminal of the third switch is connected to an input terminal of the second switch to which a current is input.

* * * * *